United States Patent
Gietler et al.

(10) Patent No.: US 10,075,058 B1
(45) Date of Patent: Sep. 11, 2018

(54) CONTROLLER TUNING USING DUTY CYCLE MISMATCH

(71) Applicant: Infineon Technologies AG, Neubiberg (DE)

(72) Inventors: Harald Gietler, Villach (AT); Andreas Berger, Klagenfurt (AT); Marc Kanzian, Wernberg (AT); Robert Priewasser, Villach (AT); Christoph Unterrieder, Rothenthurn (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/797,529

(22) Filed: Oct. 30, 2017

(51) Int. Cl.
*H02M 3/335* (2006.01)
*H03K 3/017* (2006.01)
*H02M 1/088* (2006.01)
*H02M 3/158* (2006.01)
*H02M 1/00* (2006.01)

(52) U.S. Cl.
CPC .......... *H02M 1/088* (2013.01); *H02M 3/158* (2013.01); *H02M 3/33507* (2013.01); *H02M 2001/0025* (2013.01); *H03K 3/017* (2013.01)

(58) Field of Classification Search
CPC ............ H02M 1/008; H02M 2001/0025
See application file for complete search history.

(56) References Cited

U.S. PATENT DOCUMENTS

| | | | |
|---|---|---|---|
| 9,564,807 B2 | 2/2017 | Mellteg et al. | |
| 2007/0247203 A1* | 10/2007 | Cho | H03K 5/1565 327/175 |
| 2008/0100953 A1* | 5/2008 | Sosseh | G11B 5/5582 360/78.04 |
| 2010/0141423 A1 | 6/2010 | Lin et al. | |
| 2013/0249614 A1* | 9/2013 | Zhang | H03K 7/08 327/175 |
| 2014/0192560 A1* | 7/2014 | Ou | H02M 1/40 363/16 |
| 2014/0372056 A1 | 12/2014 | Lunghlmayr et al. | |

OTHER PUBLICATIONS

Corradini, et al., "Digital Control of High-Frequency Switched-Mode Power Converters," John Wiley & Sons, 2015, 357 pp.

(Continued)

*Primary Examiner* — Jeffrey Gblende
*Assistant Examiner* — David A. Singh
(74) *Attorney, Agent, or Firm* — Shumaker & Sieffert, P.A.

(57) ABSTRACT

In an example, a device for operating a switching converter is configured to receive a composite command duty cycle value. The device is further configured to generate an effective duty cycle value based on a voltage at a switching node. The device is further configured to generate a duty cycle mismatch value using the composite command duty cycle value and the effective duty cycle value so as to generate a plurality of duty cycle mismatch values. Each duty cycle mismatch value of the plurality of duty cycle mismatch values corresponds to a candidate natural frequency value of the converter. The device is further configured to output a candidate natural frequency value of the converter that corresponds to a maximum duty cycle mismatch of the plurality of duty cycle mismatch values.

20 Claims, 12 Drawing Sheets

(56) References Cited

OTHER PUBLICATIONS

Miao, et al., "System identification of power converters with digital control through cross-correlation methods," IEEE Transactions on Power Electronics, 20(5): pp. 1093-1099, Sep. 2005.
Pitel et al., "Real-time system identification for load monitoring and transient handling of dc-dc supplies," In Proceedings of IEEE Power Electronics Specialists Conference (PESC'2008), pp. 3807-3813, Jun. 2008.
Gietler, et al., "Low-complexity, high frequency parametric system identification method for switched-mode power converters," In Proceedings of IEEE Applied Power Electronics Conference and Exposition (APEC'2017), 2004-2009, Mar. 2017, 6 pp.
Lunglmayr, et al., "Step-adaptive approximate least squares," In Proceedings of European Signal Processing Conference (EUSIPCO' 2015), pp. 1108-1112, Aug. 2015.
Stefanutti, et al., "Autotuning of digitally controlled dc-dc converters based on relay feedback," IEEE Transactions on Power Electronics, 22(1):199-207, Jan. 2007.
Gordillo, "A Simple Sensorless Current Sharing Technique for Multiphase DC-DC Buck Converters," In IEEE Transactions on Power Electronics, vol. 32, No. 5, pp. 3480-3489, May 2017.
Foley, "Sensorless Current Estimation and Sharing in Multiphase Buck Converters," In IEEE Transactions on Power Electronics, vol. 27, No. 6, pp. 2936-2946, Jun. 2012.
Priewasser, et al., "Modeling, control, and implementation of dc-dc converters for variable frequency operation," IEEE Transactions on Power Electronics, 29(1):287-301, Jan. 2014.
Algreer, et al., "Active online system identification of switch mode dc-dc power converter based on efficient recursive dcd-iir adaptive filter," IEEE Transactions on Power Electronics, 27(11):4425-4435, Nov. 2012.

\* cited by examiner

CONTROLLER TUNING USING DUTY CYCLE MISMATCH

TECHNICAL FIELD

This disclosure relates to converters, such as DC-DC power converter circuits.

BACKGROUND

Power converters may be used to generate an output power signal by converting one or more aspects of an input power signal. As one example, a DC-DC power converter may convert an input DC power signal at a first voltage level into an output DC power signal at a second voltage level. As another example, an AC-DC power converter may rectify an input AC power signal into an output DC power signal. As yet another example, a DC-AC power converter may invert an input DC power signal into an output AC power signal. In some examples, a power converter may include multiple stages. For instance, a power converter may include a DC-DC stage and a DC-AC stage.

SUMMARY

This disclosure describes techniques for tuning a power converter using a duty cycle mismatch. A natural frequency estimation module may inject duty cycle perturbations (e.g., linear chirp signal) at different frequencies for finding an estimated natural frequency at which the maximum duty cycle mismatch occurs. The estimated natural frequency may be used to tune a controller for a power converter to improve a dynamic performance of the power converter. For example, a control module may multiply each gain of a proportional-integral-derivative (PID) controller and a respective correction factor that is calculated using the estimate natural frequency to improve the dynamic performance of the power converter.

In some examples, this disclosure describes a device for operating a switching converter. The device is configured to receive, for each switching period of a plurality of switching periods, a composite command duty cycle value. The composite command duty cycle value comprises a respective duty cycle perturbation of a plurality of duty cycle perturbations superimposed on a target command duty cycle value. The device is further configured to generate, for each switching period of the plurality of switching periods, an effective duty cycle value based on a voltage at a switching node. The switching node is coupled to a high side switching element of the converter and coupled to a low side switching element of the converter. The high side switching element and the low side switching element are activated based on the composite command duty cycle value. The device is further configured to generate, for each switching period of the plurality of switching periods, a duty cycle mismatch value using the composite command duty cycle value and the effective duty cycle value so as to generate a plurality of duty cycle mismatch values. Each duty cycle mismatch value of the plurality of duty cycle mismatch values corresponds to a candidate natural frequency value of the converter. The device is further configured to output a candidate natural frequency value of the converter that corresponds to a maximum duty cycle mismatch of the plurality of duty cycle mismatch values.

In some examples, this disclosure describes a method for operating a switching converter. The method comprises receiving, for each switching period of a plurality of switching periods, a composite command duty cycle value. The composite command duty cycle value comprises a respective duty cycle perturbation of the plurality of duty cycle perturbations superimposed on a target command duty cycle value. The method further comprises generating, for each switching period of the plurality of switching periods, an effective duty cycle value based on a voltage at a switching node. The switching node is coupled to a high side switching element of a converter and coupled to a low side switching element of the converter. The high side switching element and the low side switching element are activated based on the composite command duty cycle value. The method further comprises generating, for each switching period of the plurality of switching periods, a duty cycle mismatch value using the composite command duty cycle value and the effective duty cycle value so as to generate a plurality of duty cycle mismatch values. Each duty cycle mismatch value of the plurality of duty cycle mismatch values corresponds to a candidate natural frequency value of the converter. The method further comprises outputting a candidate natural frequency value of the converter that corresponds to a maximum duty cycle mismatch of the plurality of duty cycle mismatch values.

In some examples, this disclosure describes a system comprising a voltage source, a load, a switching converter, a control module, and a natural frequency estimation module. The switching converter is configured to receive power from the voltage source and to output power to the load. The switching converter comprises a low side switching element and a high side switching element. The low side switching element has a first node coupled to a switching node, a second node coupled to a reference node, and a gate node. The high side switching element has a first node coupled to the switching node, a second node coupled to the voltage source, and a gate node. The high side switching element includes a diode having an anode coupled to the switching node and a cathode coupled to the voltage source. The control module is configured to generate a switching signal to activate the high side switching element and the low side switching element based on the composite command duty cycle value. The system identification module is configured to output, to the control module, for each switching period of a plurality of switching periods for the switching converter, a duty cycle perturbation of a plurality of duty cycle perturbations. The natural frequency estimation module is further configured receive, from the control module, a composite command duty cycle value. The composite command duty cycle value comprises a respective duty cycle perturbation of the plurality of duty cycle perturbations superimposed on a target command duty cycle value. The natural frequency estimation module is further configured to generate, for each switching period of the plurality of switching periods, an effective duty cycle value based on a voltage at the switching node. The natural frequency estimation module is further configured to generate, for each switching period of a plurality of switching periods, a duty cycle mismatch value using the composite command duty cycle value and the effective duty cycle value so as to generate a plurality of duty cycle mismatch values. Each duty cycle mismatch value of the plurality of duty cycle mismatch values corresponds to a candidate natural frequency value of the switching converter. The natural frequency estimation module is further configured to output, to the control module, a candidate natural frequency value of the switching converter that corresponds to a maximum duty cycle mismatch of the plurality of duty cycle mismatch values.

The details of one or more examples are set forth in the accompanying drawings and the description below. Other features, objects, and advantages will be apparent from the description and drawings, and from the claims.

DETAILED DESCRIPTION

Figure 1:
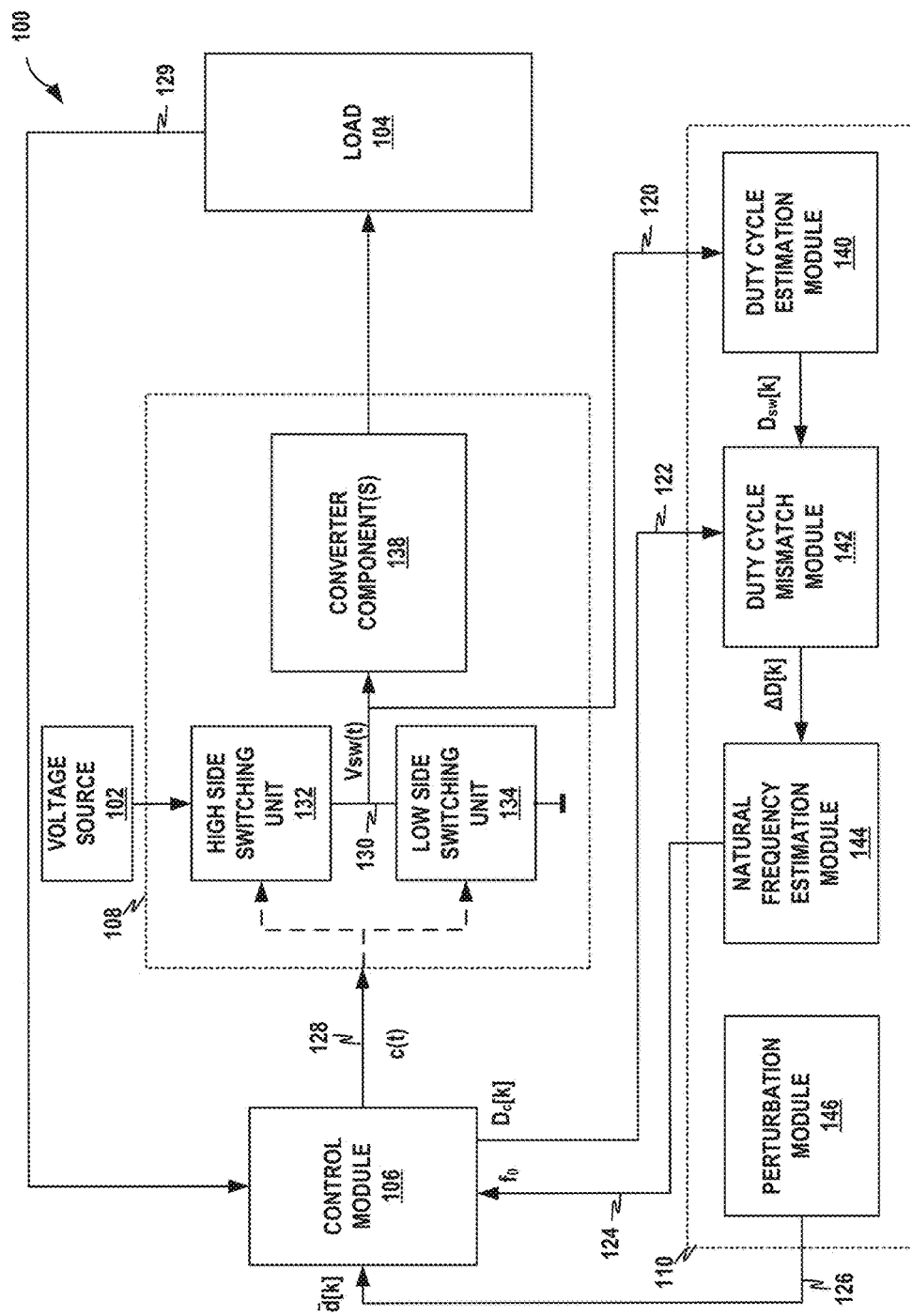
FIG. 1 is a block diagram illustrating an example system configured for controller tuning using duty cycle mismatch, in accordance with one or more techniques of this disclosure.

This disclosure is directed to an identification (online or offline) of system properties of power converters (e.g., DC-DC converters) based on measurements taken from the system. Furthermore, "online identification" in this context may refer to system identification (SI) techniques that are applied during a runtime of the system (e.g. during start-up mode or normal operation mode).

Along with the growing number of electronic devices, the demand for switched-mode power supplies (SMPSs) providing high efficiency and a well-regulated output voltage is rising. Since the SMPS's performance influences the operating range, stability and efficiency of the system, sophisticated control algorithms are frequently used. Examples of control algorithms may be found at Luca Corradini, Dragan Maksimovi'c, Paolo Mattavelli, and Regan Zane. Digital Control of High-Frequency Switched-Mode Power Converters. John Wiley & Sons, 2015, R. Priewasser, M. Agostinelli, C. Unterrieder, S. Marsili, and M. Huemer. Modeling, control, and implementation of dc-dc converters for variable frequency operation. IEEE Transactions on Power Electronics, 29(1):287-301, January 2014, and elsewhere.

Due to component tolerances, the controller is typically designed to cover a wide range of parameter values. Additionally, in applications that support various externals, such as different inductor and capacitor configurations, the parameter range typically covered by the controller increases even further. To ensure stability of the converter in all operating conditions and over all possible parameter variations the controller is typically designed in a very conservative way, which degrades the dynamic performance (e.g. when operating in nominal conditions) and increases the cost of external components. In contrast, system identification enables the tracking of the operating conditions and parameter variations, which allows self-tuning of the controller. Hence, the controller may be tuned accordingly, such that the system performance fulfills the specification limits over the parameter space while stability is maintained.

Online system identification concepts may be used for estimating the parameters of a converter. Examples of online system identification concepts may be found in, for example, B. Miao, R. Zane, and D. Maksimovic. System identification of power converters with digital control through crosscorrelation methods. IEEE Transactions on Power Electronics, 20(5):1093-1099, September 2005, M. Algreer, M. Armstrong, and D. Giaouris. Active online system identification of switch mode dc-dc power converter based on efficient recursive dcd-iir adaptive filter. IEEE Transactions on Power Electronics, 27(11):4425-4435, November 2012, G. E. Pitel and P. T. Krein. Real-time system identification for load monitoring and transient handling of dc-dc supplies. In Proceedings of IEEE Power Electronics Specialists Conference (PESC'2008), pages 3807-3813, June 2008, and elsewhere. In online system identification concepts, the steady state duty cycle is superimposed by a disturbance, which is used in conjunction with the resulting output voltage perturbation to estimate the system parameters. The downsides are the high computational complexity, memory usage, and introduced uncertainties due to the assumption of a fixed SMPS model. Recently, it has been shown that the complexity of system identification can be reduced by using advanced estimation algorithms. Examples of advanced estimation algorithms may be found at, for example, H. Gietler, C. Unterrieder, A. Berger, R. Priewasser, and M. Lunglmayr. Low-complexity, high frequency parametric system identification method for switched-mode power converters. In Proceedings of IEEE Applied Power Electronics Conference and Exposition (APEC'2017), 2004-2009, March 2017, M. Lunglmayr, C. Unterrieder, and M. Huemer. Step adaptive approximate least squares. In Proceedings of European Signal Processing Conference (EUSIPCO' 2015), pages 1108-1112, August 2015, and elsewhere. Nevertheless, on-chip implementations are often still not feasible due to the amount of operations and the duration of the stimulus injection.

In Table 1, the computational complexity of some system identification algorithms are listed. The number of parameters to be estimated is denoted by p. Furthermore, the resulting complexity for estimating the natural frequency of a typical buck converter with p=4 is also reported. In order to achieve the desired accuracy, 1500 iterations have been used.

TABLE 1

Complexity of different system identification algorithms.

| Methodology | Complexity (multiplications per iteration) | Complexity for a buck converter (total number of multiplications) | Additional remarks |
| --- | --- | --- | --- |
| Recursive Least Squares (RLS) | $\frac{p^3}{2} + 2p^2 + 4p$ | 120000 | Needed divisions are counted as multiplications |
| Dichotomous coordinate descent (DCD) - RLS | $2p^2 + 3p$ | 66000 | |
| IFX Step-adaptive Least Squares (SALS) | $3p + 2$ | 21000 | |

In this disclosure, techniques for estimating the SMPS's natural frequency are proposed. In contrast to other system identification techniques, the computational complexity is reduced, while high estimation accuracy is achieved. Furthermore, the presented concept can operate at higher switching frequencies compared to other solutions, such as, for example, M. Algreer, M. Armstrong, and D. Giaouris. Active online system identification of switch mode dc-dc power converter based on efficient recursive dcd-iir adaptive filter. IEEE Transactions on Power Electronics, 27(11): 4425-4435, November 2012 and H. Gietler, C. Unterrieder, A. Berger, R. Priewasser, and M. Lunglmayr. Low-complexity, high frequency parametric system identification method for switched-mode power converters. In Proceedings of IEEE Applied Power Electronics Conference and Exposition (APEC'2017), 2004-2009, March 2017. Because the number of switching periods for system identification is independent of the switching frequency, the overall stimulus injection time can be reduced. Subsequently, the estimated natural frequency may be used for automatic tuning of a controller, which results in improved dynamic performance and stability.

FIG. 1 is a block diagram illustrating an example system configured for controller tuning using duty cycle mismatch, in accordance with one or more techniques of this disclosure. As shown system 100 includes voltage source 102, load 104, control module 106, converter 108, and system identification module 110. System 100 may include additional components. For example, system 100 may include an analog-to-digital converter.

Voltage source 102 may be configured to provide electrical power to one or more other components of system 100. For instance, voltage source 102 may be configured to supply an input power to load 104. In some examples, voltage source 102 may be a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of the same. In some examples, voltage source 102 may be an output of a power converter. For instance, voltage source 102 may be an output of a direct current (DC) to DC power converter, an alternating current (AC) to DC power converter, and the like. In some examples, voltage source 102 may represent a connection to an electrical supply grid. In some examples, the input power signal provided by voltage source 102 may be a DC input power signal. For instance, voltage source 102 may be configured to provide a DC input power signal in the range of ~5 VDC to ~40 VDC.

Load 104 may be any suitable device configured to use power output by converter 108. In some examples, load 104 may include an electronic device. Examples of electronic devices may include, but are not limited to, mobile devices (e.g., smart phones, tablets, wearable devices, or another mobile device), computing devices (e.g., laptop, notebook, portable personal computer, or another computing device), batteries (e.g., nickel-cadmium, lead-acid, nickel-metal hydride, nickel-zinc, silver-oxide, lithium-ion, lithium polymer, or another battery), speakers, or another electronic device.

Converter 108 may be configured to receive power from voltage source 102 and output power suitable for use by load 104. Converter 108 may include switching converters, or other converters. Examples of switching converters may include, but are not limited to, flyback, buck-boost, buck, Ćuk, or another switch-mode power converter. In some examples, converter 108 may receive a voltage and output a voltage that is different from the received voltage. For instance, converter 108 may receive a battery voltage from voltage source 102 and output a regulated first voltage that is less than the battery voltage. More specifically, in some examples, converter 108 may be a buck converter that bucks (e.g., reduces) a battery voltage received from voltage source 102 to a regulated output voltage.

Converter 108 includes high side switching element 132, low side switching element 134, and one or more converter components 138 (hereinafter, converter components 138). Converter components 138 may include energy storage elements (e.g., capacitors, inductors, etc.), resistive elements, and other converter components that are selectively switched using high side switching element 132 and/or low side switching element 134.

High side switching element 132 may include, but is not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that high side switching element 132 may be voltage-controlled and/or current-controlled. Examples of current-controlled switching elements may include, but are not limited to, gallium nitride (GaN) MOSFETs, BJTs, or other current-controlled elements. Similarly, low side switching element 134 may include, but is not limited to, silicon controlled rectifier (SCR), a Field Effect Transistor (FET), and bipolar junction transistor (BJT). It should be understood that low side switching element 134 may be voltage-controlled and/or current-controlled. In some examples, low side switching element 134 may be a diode.

High side switching element 132 may activate based on the composite command duty cycle value. For example, control module 106 may generate switching signal 128 based on the composite command duty cycle value. In this example, converter 108 may generate a gate driving signal to activate high side switching element 132 based on switching signal 128. For instance, converter 108 may add a dead time to the switching signal 128. Similarly, low side switching element 134 may activate based on the composite command duty cycle value. For example, converter 108 may generate a gate driving signal to activate low side switching element 134 based on switching signal 128. It should be understood that the dead time may not necessarily be generated by converter 108, for example, the dead time may be generated by control module 106, a controller, a driver stage, or another component of system 100.

Control module 106 may be configured to generate a switching signal 128 ("c(t)") for activating high side switching element 132 and low side switching element 134. In some examples, control module 106 may control converter 108 to output a voltage and/or current to load 104. For instance, control module 106 may regulate a voltage and/or current at load 104 using feedback signal 129. In some examples, control module 106 may include an analog circuit. In some examples, control module 106 may be a microcontroller on a single integrated circuit containing a processor core, memory, inputs, and outputs. For example, control module 106 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, control module 106 may be a combination of one or more analog components and one or more digital components.

Control module 106 may include a pulse-width modulator to generate switching signal 128. For example, control module 106 may include a pulse-width modulator configured to generate a switching signal to activate high side switching element 132 and low side switching element 134 based on the composite command duty cycle value.

System identification module 110 may be configured to estimate a natural frequency of converter 108 to tune control module 106. As shown, system identification module 110 may include duty cycle estimation module 140, duty cycle mismatch module 142, natural frequency estimation module 144, and perturbation module 146.

Perturbation module 146 may be configured to output duty cycle perturbations 126 ("d") to control module 106. For example, perturbation module 146 may output, for each switching period, a duty cycle perturbation to generate a composite command duty cycle value ("Dc[k]"). In some examples, control module 106 may superimpose the duty cycle perturbation on a target command duty cycle value to generate the composite command duty cycle value.

Perturbation module 146 may generate duty cycle perturbations 126 as a linear chirp signal, a non-linear chirp signal, a rectangular chirp signal, or another signal. In the example of FIG. 1, perturbation module 146 generates duty cycle perturbations 126, however, in other examples, another device or component of system 100 may generate duty cycle perturbations 126.

Duty cycle estimation module 140 may be configured to receive an indication of voltage 120 ("Vsw(t)") at switching node 130 and generate, based on the voltage 120, to duty cycle mismatch module 142, an effective duty cycle value ("$D_{sw}[k]$"). For example, duty cycle estimation module 140 may generate, for each switching period, an effective duty cycle value based on a voltage at switching node 130. In some examples, duty cycle estimation module 140 may be configured to directly receive voltage 120. In some examples, duty cycle estimation module 140 may be configured to receive rising and falling edges of voltage 120, e.g. as an output from a comparator.

Duty cycle mismatch module 142 is configured to, for each switching period ("k"), receive the effective duty cycle value from duty cycle estimation module 140 and a composite command duty cycle value 122 ("Dc[k]") from control module 106 and to generate, based on the received effective duty cycle value and the composite command duty cycle value, a duty cycle mismatch value ("ΔD[k]"). In some examples, each duty cycle mismatch value of the duty cycle mismatch values corresponds to a candidate natural frequency value of converter 108. For instance, a chirp signal generated by perturbation module 146 may cause the composite command duty cycle value to activate high side switching element 132 and low side switching element 134 at a different frequency for each switching period. In this instance, each duty cycle mismatch value corresponds to a particular frequency that high side switching element 132 and low side switching element 134 are activated for a given switching period. In some examples, the frequency for each switching period does not necessarily differ in each switching period. For example, perturbation module 146 may generate a chirp signal that has a constant frequency for more than one (e.g., a couple) switching periods.

Natural frequency estimation module 144, is configured to receive the duty cycle mismatch values from duty cycle mismatch module 142 and to generate, based on the received duty cycle mismatch values for different switching periods, a candidate natural frequency value 124 ("$f_0$"). For example, natural frequency estimation module 144 may output a candidate natural frequency value of converter 108 that corresponds to a maximum duty cycle mismatch of the duty cycle mismatch values.

Figure 2:
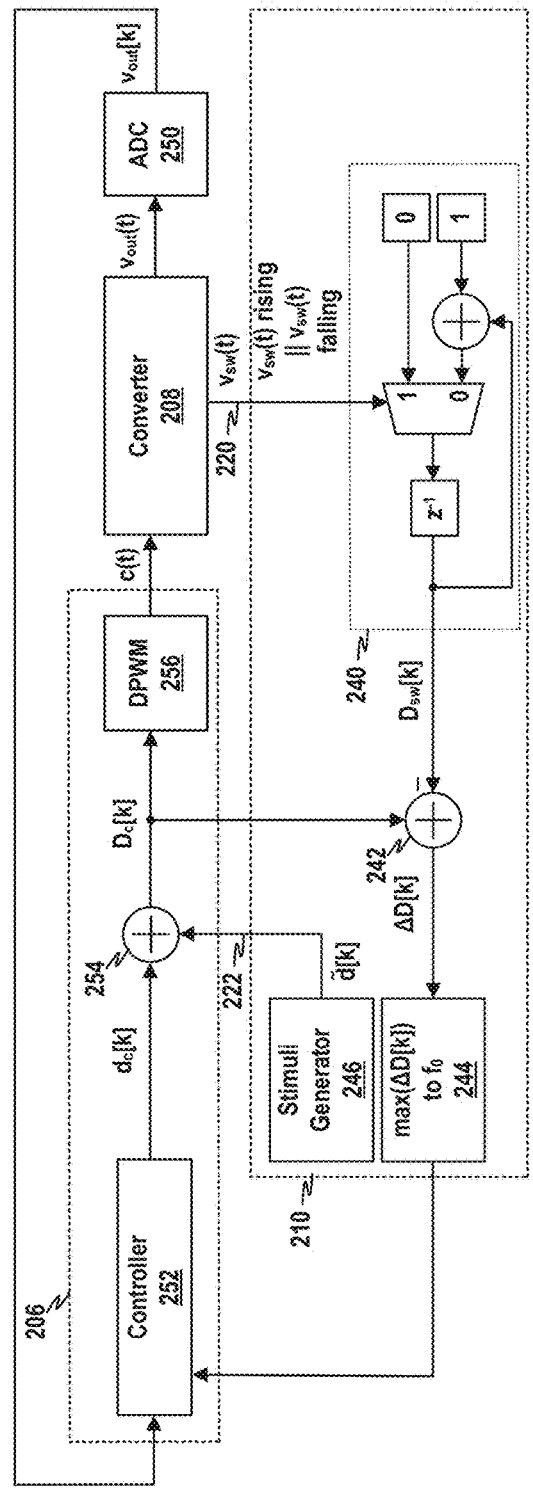
FIG. 2 is a block diagram illustrating an example system identification module configured for use with a control module, in accordance with one or more techniques of this disclosure.

FIG. 2 is a block diagram illustrating an example system identification module 210 configured for use with a control module 206, in accordance with one or more techniques of this disclosure. As shown, system 200 may include control module 206, converter 208, analog-to-digital converter 250, and system identification module 210. Control module 206 may be an example of control module 106 of FIG. 1. Converter 208 may be an example of converter 108 of FIG. 1. System identification module 210 may be an example of system identification module 110 of FIG. 1. Analog-to-digital converter 250 may be configured to convert an analog signal ("$V_{out}(t)$") into a digital signal ("$V_{out}[k]$") suitable for use by control module 206.

System identification module 210 may include duty cycle estimation module 240, duty cycle mismatch module 242, natural frequency estimation module 244, and stimuli generator 246. Duty cycle estimation module 240 may generate an effective duty cycle value. For instance, duty cycle estimation module 240 may determine a rising edge of voltage 220, which may correspond to (e.g., match, represent, be proportional to, etc.) a voltage at the switching node (e.g., switching node 130 of FIG. 1). In this example, duty cycle estimation module 240 may determine a falling edge of the voltage at the switching node. In this example, duty cycle estimation module 240 may generate the effective duty cycle value based on the falling edge and the rising edge. More specifically, for example, duty cycle estimation module 240 may reset a count value in response to the rising edge of voltage 220. In this example, duty cycle estimation module 240 may increment the count value until the falling edge. Although duty cycle estimation module 240 illustrates digital components, in some examples, duty cycle estimation module 240 may be implemented using analog components.

Duty cycle mismatch module 242 may generate the duty cycle mismatch value. For example, duty cycle mismatch module 242 may subtract the effective duty cycle value ("Dsw[k]") from the composite command duty cycle value ("Dc[k]").

Frequency estimation module 244 may output the candidate natural frequency value ("$f_0$"). For example, frequency estimation module 244 may output a candidate natural frequency value that corresponds to a maximum duty cycle mismatch value output by the duty cycle mismatch module 242 (e.g., max(ΔD[k])).

Control module 206 may include controller 252, summer 254, and digital pulse-width modulator ("DPWM") 256. Controller 252 may be tuned using the candidate natural frequency value. For example, controller 252 may be a proportional-integral-derivative (PID) controller. In some examples, controller 252 may be a state-space controller. Controller 252 may receive, from frequency estimation module 244, the candidate natural frequency value. In this example, controller 252 may calculate tuned coefficients to improve a dynamic performance of converter 208.

In the example of FIG. 2, an exemplary basic principle of the proposed concept is illustrated. A chirp signal 222 (e.g., a linear chirp signal due to simpler calculation of $f_0$ d[k]) may be generated by the stimuli generator 246 and superimposed on the duty cycle $d_c$[k], which can be a static duty cycle or the output of a controller. For instance, control module 206 may generate the target command duty cycle value to be static during the switching periods. In some examples, the target command duty cycle value operates the converter in discontinuous conduction mode (DCM). In some examples, the target command duty cycle value operates the converter in a region where inductor current (e.g., inductor 362 of FIG. 3) of converter 208 is partially negative during a switching period. In some examples, the target command duty cycle value causes the inductor current to be negative for a large portion of a switching period, which may improve the estimation accuracy.

The composite command duty cycle value ("$D_c$[k]=$d_c$[k]+$\tilde{d}$[k]") is fed to DPWM 256, which generates the actuating signals for the power switches of converter 208. In order to measure the effective duty cycle at the switching node $v_{sw}$, duty cycle estimation module 240 may use a counter. Duty cycle estimation module 240 may reset the counter upon each rising edge of $v_{sw}$. In this example, duty cycle estimation module 240 may hold its value as soon as $v_{sw}$ becomes low (e.g., only the rising and falling edge of $v_{sw}$ have to be detected), thus resulting in the effective duty cycle $D_{sw}$[k] in the k-th switching period. Duty cycle mismatch module 242 calculates the duty cycle mismatch value by subtracting the known duty cycle from the counter value resulting in ΔD[k]=$D_c$[k]−$D_{sw}$[k].

Natural frequency estimation module 244 calculates, based on the maximum duty cycle mismatch value, the estimate $\hat{f}_0$, which can be used to tune controller 252. If max(ΔD) is not unique, $\hat{f}_0$ may, for example, be calculated by taking the average of arg max(ΔD). Said differently, when a first and second duty cycle mismatch value both correspond to a maximum duty cycle mismatch value, natural frequency estimation module 244 may output a candidate natural frequency value of converter 208 that corresponds to a maximum duty cycle mismatch such that the candidate natural frequency value is an average of a first candidate natural frequency value of converter 208 that corresponds to the first duty cycle mismatch value and a second candidate natural frequency value of converter 208 that corresponds to the second duty cycle mismatch value.

With the proposed techniques, a significant reduction of complexity when compared to solutions can be achieved. For example, only one addition is performed per switching period (calculation of ΔD[k]) when using the proposed techniques compared to systems that do not utilize duty cycle mismatch values. In another example, the proposed techniques do not use multiplications. In another example, the proposed techniques have reduced memory utilization compared to other solutions. For instance, the proposed techniques may store only a maximum duty cycle mismatch ("max(ΔD[k])"). In contrast, for some other solutions, all output voltage measurements during the stimulus injection are stored (e.g. 512×8 bit values for a buck converter). Moreover, the proposed techniques do not necessarily assume a fixed model of the converter. Further, the proposed techniques do not use an output voltage measurement.

In Table 2, a comparison between one of the most efficient algorithms and the proposed concept in terms of complexity is given.

TABLE 2

Comparison of an algorithm to the proposed concept.

| | DCD-RLS | Proposed Concept |
|---|---|---|
| Multi-plications | $2p^2 + 3p$ (for a buck converter p = 4; for a stimulus injection time of 512 switching cycles with 1500 iteration of the algorithm-to achieve sufficient accuracy-this yields 66000 multiplications) | 0 |
| Additions | $p^2 + 4p + 2$ (for a buck converter p = 4; for a stimulus injection time of 512 switching cycles with 1500 iteration of the algorithm-to achieve sufficient accuracy-this yields 51000 additions) | One addition per switching cycle during stimulus injection (e.g. total of 512 additions for a stimulus of 512 switching cycles) |
| Memory Elements | One output voltage sample per switching period has to be stored during the stimulus injection (e.g. 512 × 8 bit for a 8 bit ADC and 512 switching cycles stimuli injection time) | Only the current max(ΔD[k]) during the stimulus injection has to be stored (e.g. log2(f_digi/f_sw) 1 × 6 bit for 100 Mhz f_digi and 1.56 MHz_f_fsw) |
| Hardware Utilization | Output voltage has to be sampled in each switching cycle by an ADC | Only rising/falling edge of $v_{sw}$ is of interest, a comparator or low resolution ADC can be used |

Figure 3:
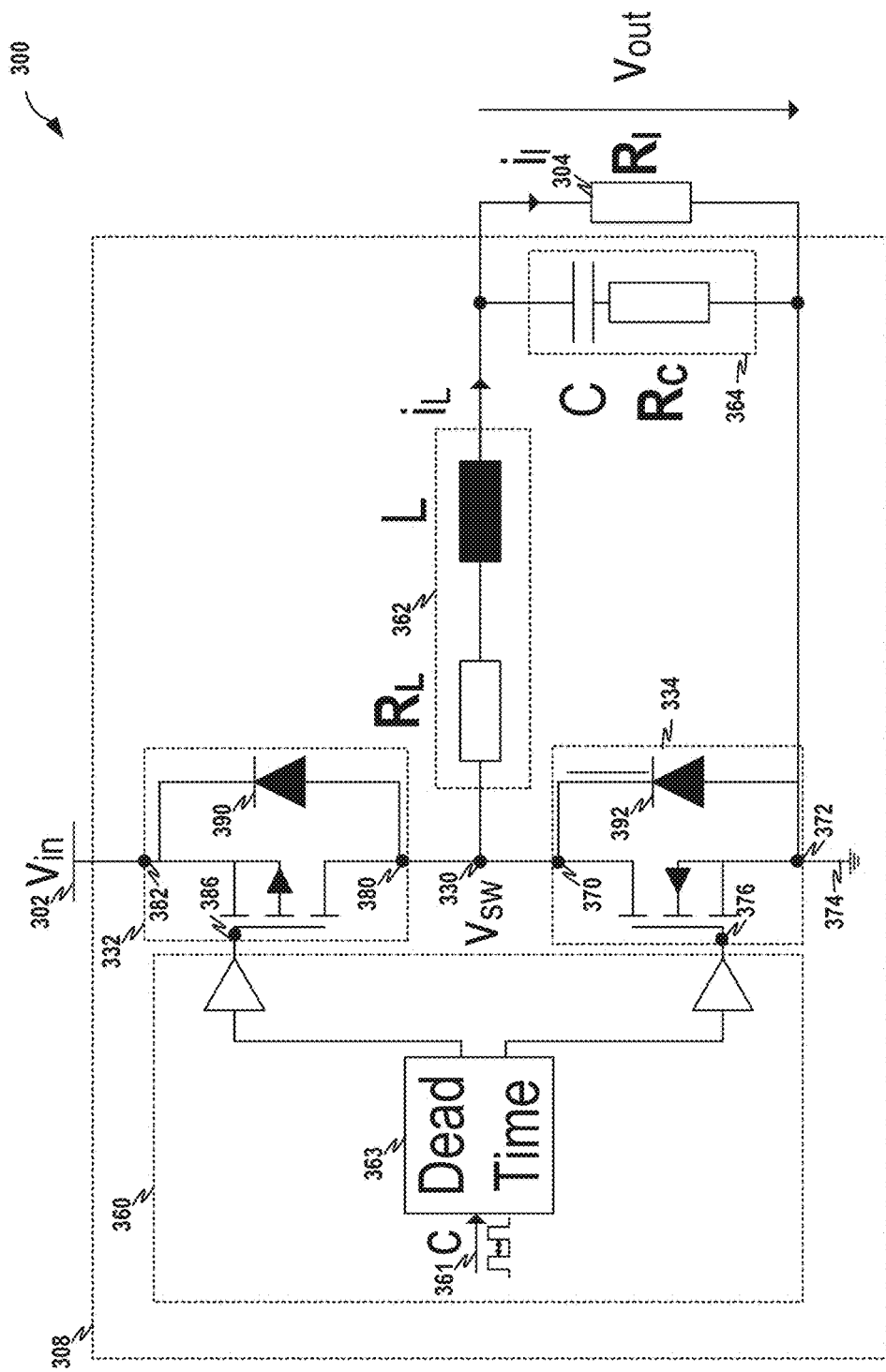
FIG. 3 is a circuit diagram illustrating an example converter configured for use with a system identification module, in accordance with one or more techniques of this disclosure.

FIG. 3 is a circuit diagram illustrating an example converter 308 configured for use with system identification module (e.g., system identification module 110), in accordance with one or more techniques of this disclosure. System 300 may include converter 308, voltage source 302, and load 304. Voltage source 302 may be an example of voltage source 102 of FIG. 1. Load 304 may be an example of load 104 of FIG. 1. Converter 308 may be an example of converter 108 of FIG. 1. As shown, converter 308 may include dead time module 363, high side switching element 332, low side switching element 334, inductor 362, and capacitor 364.

In the example of FIG. 3, converter 308 is arranged as a synchronous buck converter. Note that although high side switching element 332 includes a PMOS as a high-side switch, the presented concept is also applicable to converters with an NMOS high-side switch. Furthermore, the proposed concept is also applicable to other converter types, particularly, converters that permit conduction of a body diode or free-wheeling diode of high side switching element 332. Therefore, this disclosure is not limited to converters with MOSFET power switches. In order to achieve the desired output voltage, the power switches (e.g., high side switching element 332, low side switching element 334, etc.) are controlled by switching signal 361 ("c") with duty cycle $D_c$.

To prevent shoot-through, that is simultaneous conduction of high side switching element 332 and low side switching element 334, appropriate dead times are generated. For example, dead time module 363 may generate a modified switching signal based on switching signal 361 that deactivates high side switching element 332 and low side switching element 334 before activating low side switching element 334 and that deactivates high side switching element 332 and low side switching element 334 before activating high side switching element 332.

As shown in FIG. 3, low side switching element 334 has a first node 370 coupled to switching node 330, a second node 372 coupled to a reference node 374, and a gate node 376. Examples of a reference node 374 may include, but are not limited to, an earth ground, ground plane, chassis ground, signal ground, a reference node not associated with a ground, or another reference node. Gate node 376 may receive a low side driving signal that is generated using the composite command duty cycle value. For instance, gate node 376 may receive a low side driving signal that is generated by dead time module 363. In some examples, low side switching element 334 may include a body diode 392 having an anode coupled to reference node 374 and a cathode coupled to switching node 330. In some examples, a diode (e.g., discrete) may be additionally, or alternatively be used, where the diode has an anode coupled to reference node 374 and a cathode coupled to switching node 330.

Similarly, high side switching element 332 has a first node 380 coupled to switching node 330, a second node 382 coupled to voltage source 302, and a gate node 386. Gate node 386 may receive a high side driving signal that is generated using the composite command duty cycle value. For instance, gate node 386 may receive a low side driving signal that is generated by dead time module 363. In some examples, high side switching element 332 may include a body diode 390 having an anode coupled to switching node 330 and a cathode coupled to voltage source 302. In some examples, a diode (e.g., discrete) may be additionally, or alternatively be used, where the diode has an anode coupled to switching node 330 and a cathode coupled to voltage source 302.

As shown in FIG. 3, converter 308 may include inductor 362 having a first node coupled to switching node 330 and second node. In this example, converter 308 may include capacitor 364 having a first node coupled to the second node of the inductor and a second node coupled to reference node 374.

Figure 4:
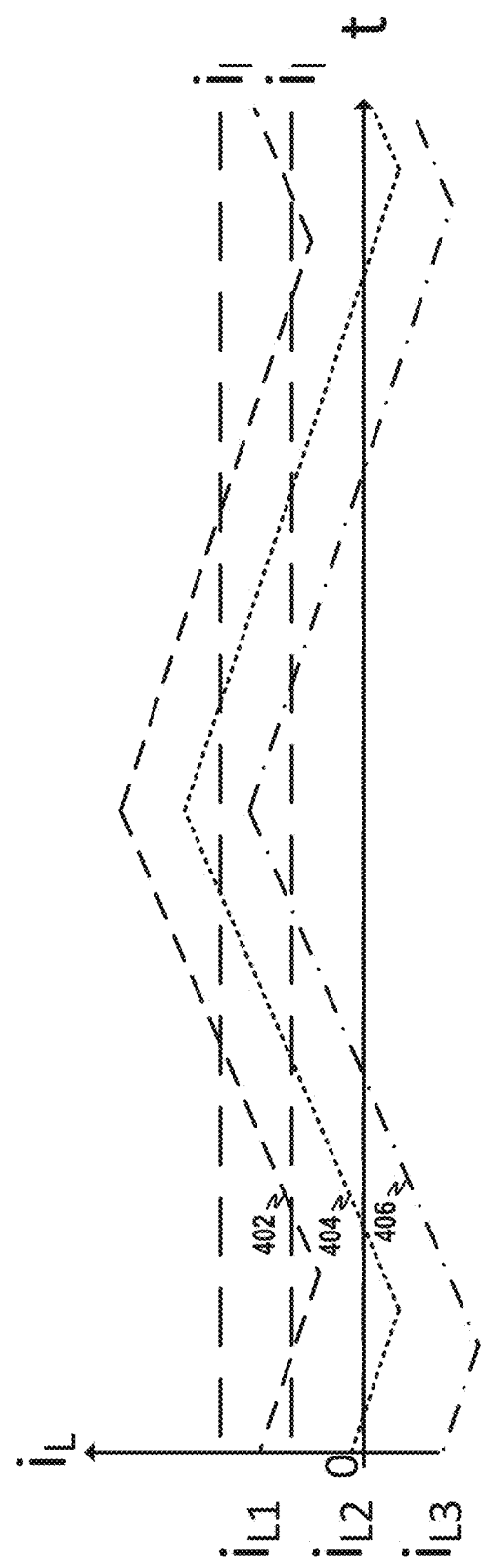
FIG. 4 is a graphical illustration of exemplary inductor current waveforms for different load currents, in accordance with one or more techniques of this disclosure.

FIG. 4 is a graphical illustration of exemplary inductor current waveforms for different load currents, in accordance with one or more techniques of this disclosure. The abscissa axis (e.g., horizontal) of FIG. 4 represents time and the ordinate axis (e.g., vertical) of FIG. 4 represents a first current 402 at inductor 362 of FIG. 3 for a relatively heavy loading, a second current 404 at inductor 362 of FIG. 3 for a relatively moderate loading, and a third current 406 at inductor 362 of FIG. 3 for a relatively light loading. In the example of FIG. 4, for small load currents, negative coil current during a fraction of the switching period is observed, see second current 404 and third current 406.

Figure 5:
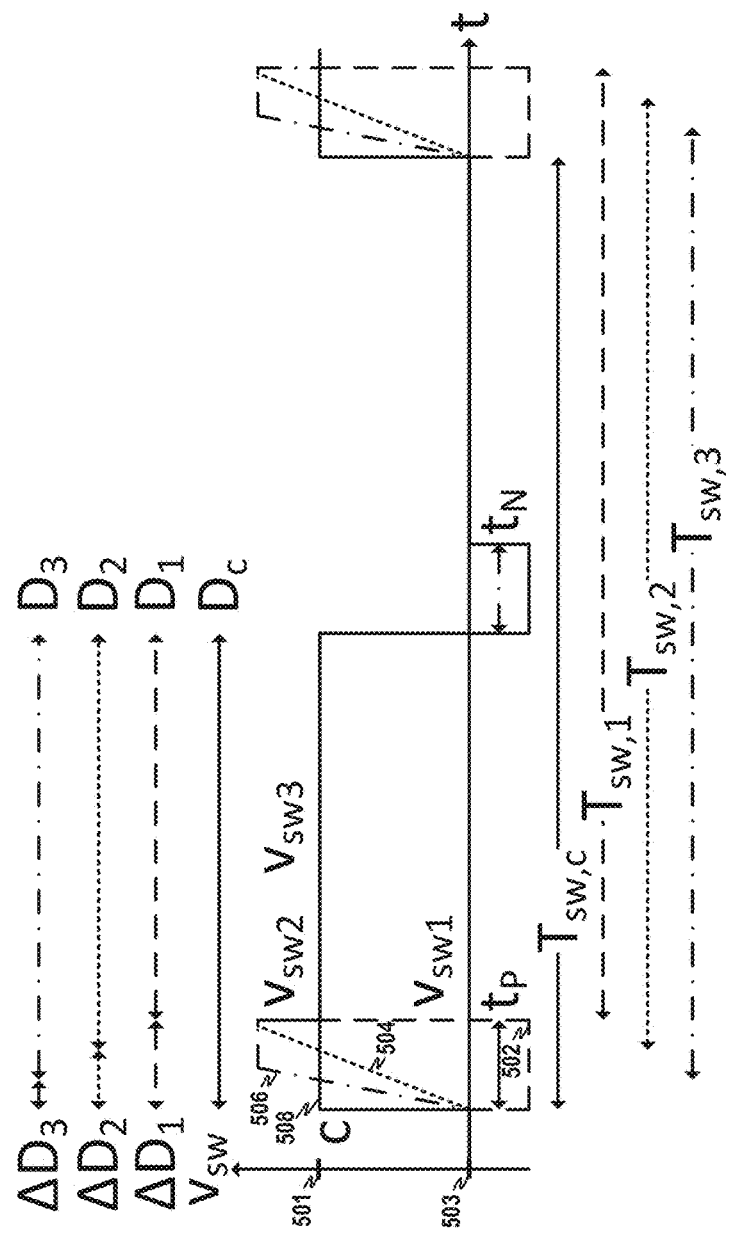
FIG. 5 is a graphical illustration of exemplary duty cycles for the different load currents of FIG. 4, in accordance with one or more techniques of this disclosure.

FIG. 5 is a graphical illustration of exemplary duty cycles for the different load currents of FIG. 4, in accordance with one or more techniques of this disclosure. The abscissa axis (e.g., horizontal) of FIG. 5 represents time and the ordinate axis (e.g., vertical) of FIG. 5 represents a first switching node signal 502 at switching node 330 of FIG. 3 for a relatively heavy loading, a second switching node signal 504 at switching node 330 of FIG. 3 for a relatively moderate loading, a third switching node signal 506 at switching node 330 of FIG. 3 for a relatively light loading, and a control node signal 508 relative to high level 501 and low level 503.

In the example of FIG. 5, upon a rising edge of the control node signal 508 ("c"), the low-side switch is turned off while the high-side switch is still kept off for the dead time $t_P$. If $i_L$ is positive during this interval, the body diode of the low-side switch starts to conduct, since the potential at $v_{sw}$ is negative. Similar behavior is also observed at the falling edge of c. The high-side switch is turned off and the body diode of the low-side switch starts to conduct during the dead time $t_N$. Due to the delayed turn on of the high-side switch, a mismatch ΔD between the duty cycles of c and $v_{sw}$ is observed.

If the coil current $i_L$ is negative at the beginning of the switching period, the body diode of the low-side switch does not start to conduct. Instead, caused by the reverse direction of the current $i_L$, the potential of the node $v_{sw}$ increases and the body diode of the high-side switch starts to conduct, resulting in an shorter turn on delay when compared with the previous case. Thus, the duty cycle mismatch ΔD is reduced, as shown in FIG. 5. With decreasing $i_L$, the mismatch ΔD also shortens, since the slope $(dv_{sw})/dt$ increases.

It is worth noting that the described effect is also observed when dead time compensation is used. With dead time compensation the effective duty cycle $D_{sw}$ will be larger than $D_c$ if the high-side body diode starts to conduct. Therefore, dead time compensation does not have a negative impact on the proposed concept.

Figure 6:
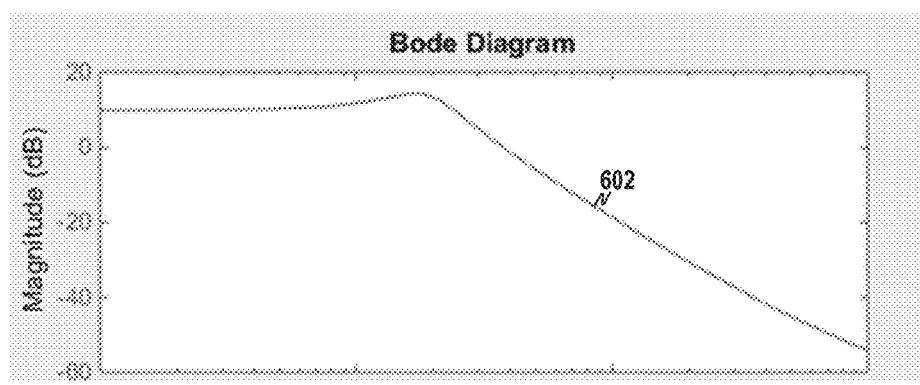
FIG. 6 is a graphical illustration of a magnitude of a Bode diagram, in accordance with one or more techniques of this disclosure.
Figure 7:
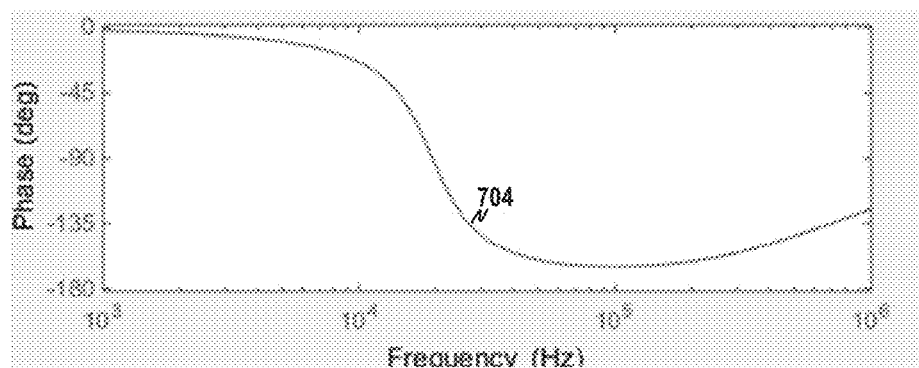
FIG. 7 is a graphical illustration of a phase of a Bode diagram for the magnitude of FIG. 6, in accordance with one or more techniques of this disclosure.

FIG. 6 is a graphical illustration of a magnitude of a Bode diagram, in accordance with one or more techniques of this disclosure. The abscissa axis (e.g., horizontal) of FIG. 6 represents frequency and the ordinate axis (e.g., vertical) of FIG. 6 represents a magnitude 602. FIG. 7 is a graphical illustration of a phase of a Bode diagram for the magnitude of FIG. 6, in accordance with one or more techniques of this disclosure. The abscissa axis (e.g., horizontal) of FIG. 6 represents frequency and the ordinate axis (e.g., vertical) of FIG. 6 represents a phase 704.

In the example of FIGS. 6 and 7, a small-signal transfer function from duty cycle to inductor current exhibits the highest gain at the resonant frequency. For example, a p-MOS body diode (e.g., body diode 390 of FIG. 3) conduction most likely results in a highest mismatch between the control signal and the effective duty cycle. As such, the resonant frequency is close to the natural frequency for the unloaded converter. In some examples, a highest accuracy may occur at light loads. More specifically, for example, for a buck converter, the natural frequency may be calculated as follows.

$$f_0 = \frac{1}{2\pi}\sqrt{\frac{R_l + R_L}{LC(R_l + R_C)}}, \quad (1)$$

In this disclosure, a concept for estimating the natural frequency by exploiting the duty cycle mismatch caused by the aforementioned effect is proposed. For this purpose, the converter is operated under light load conditions (e.g., below the DCM boundary), which causes the body diode of the high-side switch to conduct, as previously explained. The natural frequency of the converter can be estimated by injecting duty cycle perturbations (e.g. a linear chirp) at different frequencies and finding the frequency at which the largest duty cycle mismatch occurs, since the peak value of the inductor current depends on the perturbation frequency. The small-signal transfer function from duty cycle to inductor current exhibits the highest gain at the resonant frequency, which is close to the natural frequency $f_0$ for the unloaded converter. Therefore, the amplitude of the inductor current increases the most for a duty cycle perturbation frequency of $f_0$. Consequently, also the highest duty cycle mismatch may be observed. In some examples, by using a linear chirp signal, a wide frequency range is covered and the estimate $\hat{f}_0$ is calculated from the time instant at which the maximum $\Delta D$ occurs.

Figure 8:
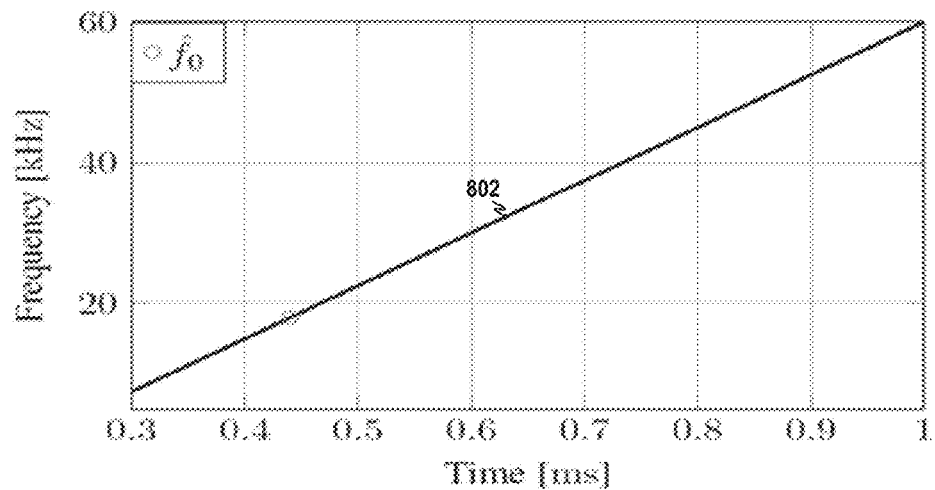
FIG. 8 is a graphical illustration of a linear chirp signal, in accordance with one or more techniques of this disclosure.

FIG. 8 is a graphical illustration of a linear chirp signal, in accordance with one or more techniques of this disclosure. The abscissa axis (e.g., horizontal) of FIG. 8 represents time and the ordinate axis (e.g., vertical) of FIG. 8 represents a frequency of a chirp signal 802.

In the example of FIG. 8, a duty cycle perturbation of the duty cycle perturbations comprises a frequency different from another duty cycle perturbation of the duty cycle perturbations. In some examples, the chirp signal may be a linear chirp signal. For instance, each duty cycle perturbation of the duty cycle perturbations may have a higher frequency than a previous duty cycle perturbations. In some instances, each duty cycle perturbation of the duty cycle perturbations may have a lower frequency than a previous duty cycle perturbations. In some examples, the chirp signal may be non-linear.

Two duty cycle perturbations may be the same, hence leading to the same frequency. For example, if first a wide frequency range for the chirp signal is chosen and in a second step a reduced frequency range with a finer resolution is selected. Said differently, for example, perturbation module 146 of FIG. 1 may generate a course chirp signal that spans a wide frequency range at a relatively course resolution. In this example, natural frequency estimation module 144 outputs a first candidate natural frequency value that corresponds to a maximum duty cycle mismatch for the course chirp signal. In this example, perturbation module 146 of FIG. 1 may generate a fine chirp signal that spans a narrow frequency range, that is selected based on the first candidate natural frequency value, at a relatively fine resolution. Natural frequency estimation module 144 may output a second candidate natural frequency value that corresponds to a maximum duty cycle mismatch for the fine chirp signal.

Figure 9:
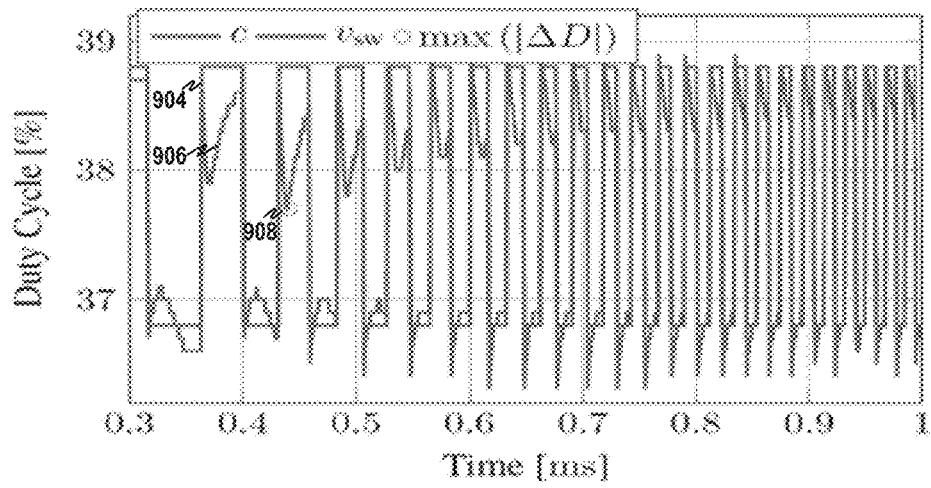
FIG. 9 is a graphical illustration of a duty cycle mismatch for the linear chirp signal of FIG. 8, in accordance with one or more techniques of this disclosure.

FIG. 9 is a graphical illustration of a duty cycle mismatch for the linear chirp signal 802 of FIG. 8, in accordance with one or more techniques of this disclosure. The abscissa axis (e.g., horizontal) of FIG. 9 represents time and the ordinate axis (e.g., vertical) of FIG. 9 represents a composite command duty cycle value 904, an effective duty cycle value 906, and a maximum duty cycle mismatch value 908.

A prototype comprised of a buck converter and an FPGA has been assembled to verify the concept presented in the previous section. The parameters of the buck converter are reported in Table 3. The experiments have been carried out for two different output capacitor configurations, one "low-end" configuration with C=10 μF and a "high-end" configuration with C=22 μF. The natural frequency estimation as well as the digital controller and its auto-tuning have been implemented on the FPGA. The clock of the FPGA has been set to $f_s$=200 MHz, resulting in a DPWM resolution of 5 ns. A linear sinusoidal chirp signal with 0.5 ms duration and a peak-to-peak amplitude of 10 DPWM steps has been used as stimulus for the duty cycle. The frequency range has been chosen from 1 kHz to 60 kHz, which ensures that the natural frequency of the converter is covered.

TABLE 3

| Synchronous Buck Converter Parameters | |
|---|---|
| Parameter | Value |
| $v_{in}$ | 3.3 V |
| L | 3.3 μH |
| C | 10/22 μF |
| $R_C$ | 10 mΩ |
| $R_L$ | 105 mΩ |
| $R_O$ | 8.3 mΩ |
| $f_{sw}$ | 1 MHz |
| $f_0$ | 27.8/18.7 kHz |

In the example of FIGS. 8 and 9, a simulation for a converter with the parameters listed in Table 3 has been used. As can be seen in FIG. 8, the frequency of the (e.g., rectangular) chirp signal 802, superimposed on a constant duty cycle, increases linearly over time. In some example, a linear chirp waveform may be spectral shapeable by design (must cover natural frequency range). For example, a linear chip waveform may be implemented in a look-up table or using an approximation of trigonometric functions (e.g., cordic).

The duty cycle of the control command c, which is modulated by the chirp, as well as the effective duty cycle at the switching node $v_{sw}$ are reported in FIG. 9. The largest duty cycle error max($\Delta D$) (e.g., maximum duty cycle mismatch value 908) can be observed at approximately 440 μs, which, as can be seen in FIG. 9, results in an estimated natural frequency of $\hat{f}_0$=18 kHz, which is close to the true value $f_0$=18.7 kHz.

The estimated natural frequency $\hat{f}_0$ may be consequently used to tune the controller with the objective of improving the dynamic performance. Exemplarily, a proportional-integral-derivative (PID) controller (e.g., controller 252 of FIG. 2) with $K_{p,m}$, $K_{i,m}$ and $K_{d,m}$ the proportional, integral and derivative gains is initially chosen based on the worst case converter parameter model m, thus ensuring stability under all operating conditions and parameters variations. Furthermore, the natural frequency $f_{0,m}$ of the converter with worst case parameters is calculated by equation (1). After the estimate $\hat{f}_0$ is obtained by the proposed techniques, the controller may be tuned. As a first step, a correction factor, may be defined as follows.

$$\kappa = \frac{\hat{f}_0}{f_{0,m}} \quad (2)$$

Then, utilizing the correction factor, it is possible to calculate the tuned coefficients as follows.

$$K_{p,t} = \kappa K_{p,m} \quad (3A)$$

$$K_{i,t} = \kappa K_{i,m} \quad (3B)$$

$$K_{d,t} = \kappa K_{d,m} \quad (3C)$$

Equations 3A, 3B, 3C, when implemented in a controller may improve the dynamic performance of the controller compared to controllers that do not utilize correction factors, while still maintaining stability. For example, control module 106 of FIG. 1 may determine a correction factor (e.g., κ) for a gain for proportional-integral-derivative (PID) controller using the candidate natural frequency value ("$f_{0,m}$"). For instance, control module 106 of FIG. 1 may calculate equation (2) using a candidate natural frequency value output by system identification module 110. In this example, control module 106 of FIG. 1 may determine a tuned coefficient gain using the correction factor. For example, control module 106 of FIG. 1 may calculate one or more of equations (3A)-(3B) using the correction factor (e.g., κ). In this example, control module 106 of FIG. 1 may output, to a PID controller (e.g., controller 252 of FIG. 2), an indication of the tuned coefficient gain (e.g., $K_{p,t}$, $K_{i,t}$, $K_{d,t}$, etc.).

Figure 10:
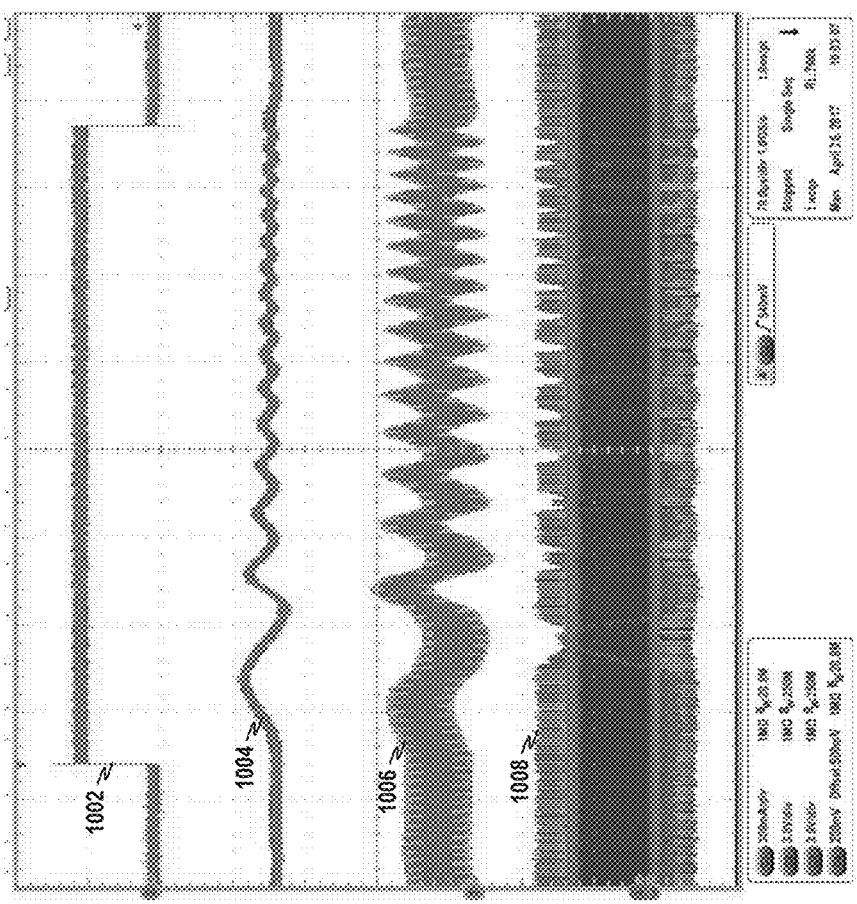
FIG. 10 is a graphical illustration of converter waveforms in response to duty cycle perturbations, in accordance with one or more techniques of this disclosure.

FIG. 10 is a graphical illustration of converter waveforms in response to duty cycle perturbations, in accordance with one or more techniques of this disclosure. The abscissa axis (e.g., horizontal) of FIG. 10 represents time and the ordinate axis (e.g., vertical) of FIG. 10 represents a system identification enable signal 1002, an output voltage 1004 to a load, inductor current 1006 at an inductor of a converter, and a perturbed switching node voltage 1008. In some examples, one or more system identification techniques described herein may be used only when the system identification mode is active (e.g., when system identification enable signal 1002 is a logical '1'.

For the experimental set-up, a test chip of the Aurix 2G DC-DC converter has been used. The proposed SI algorithm and controller have been implemented on an FPGA. In FIG. 10, perturbed switching node voltage 1008 ("$v_{sw}$"), inductor current 1006 ("$i_L$") and the output voltage 1004 ("$v_{out}$") during SI with the proposed techniques can be seen. The injected duty cycle stimulus causes perturbations of both the output voltage and inductor current, which magnitudes depend on the stimulus' amplitude.

Figure 11:
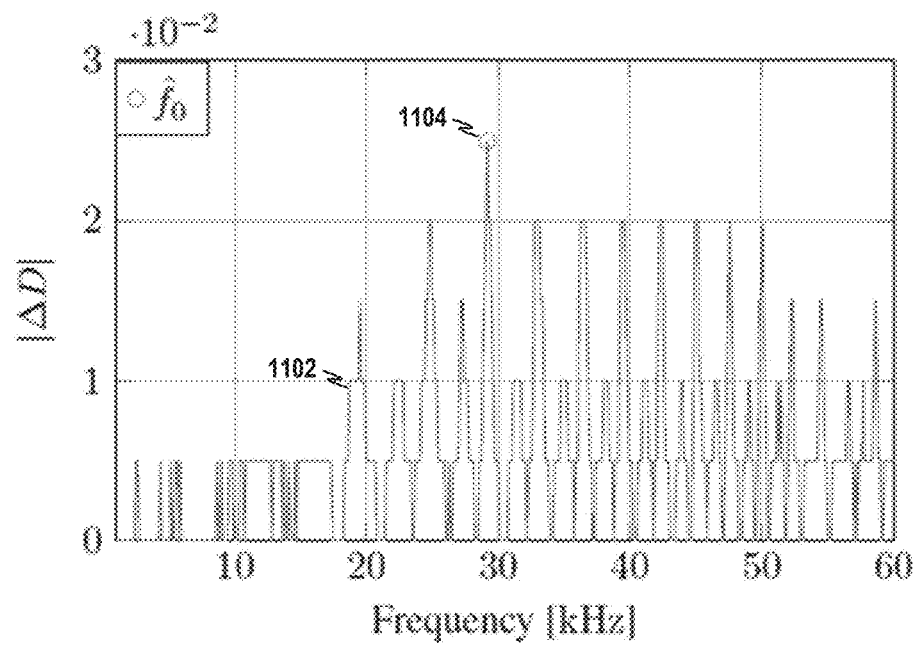
FIG. 11 is a graphical illustration of duty cycle mismatch values for duty cycle perturbations at different frequencies for a low-end configuration, in accordance with one or more techniques of this disclosure.

FIG. 11 is a graphical illustration of duty cycle mismatch values for duty cycle perturbations at different frequencies for a low-end configuration, in accordance with one or more techniques of this disclosure. The abscissa axis (e.g., horizontal) of FIG. 11 represents frequency (kHz) and the ordinate axis (e.g., vertical) of FIG. 11 represents duty cycle mismatch values 1102 for a low-end configuration with a capacitance of 10 microfarads (μF). As shown, the maximum duty cycle mismatch value 1104 of 0.025 corresponds to an estimated natural frequency of 30 kHz.

Figure 12:
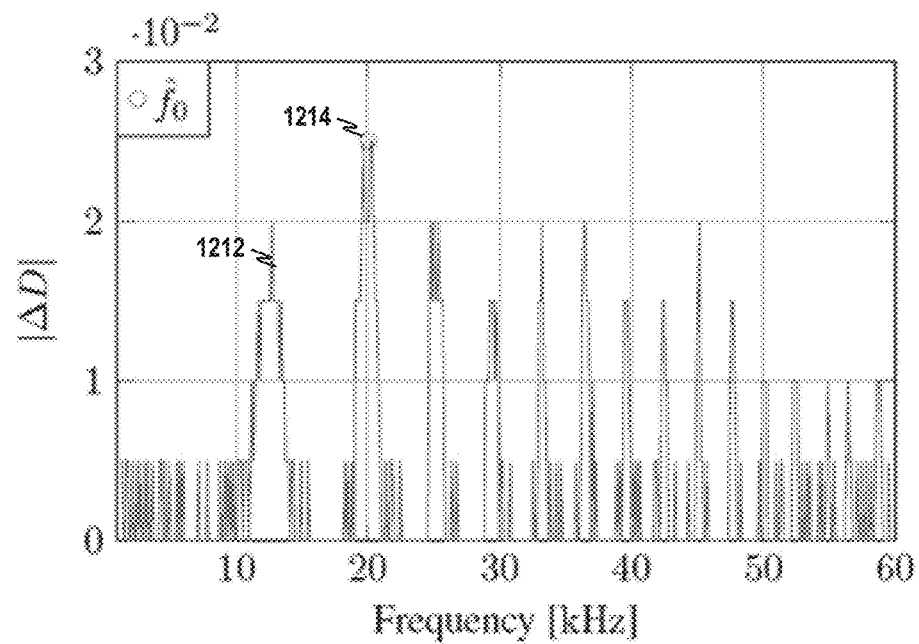
FIG. 12 is a graphical illustration of duty cycle mismatch values for duty cycle perturbations at different frequencies for a high-end configuration, in accordance with one or more techniques of this disclosure.

FIG. 12 is a graphical illustration of duty cycle mismatch values for duty cycle perturbations at different frequencies for a high-end configuration, in accordance with one or more techniques of this disclosure. The abscissa axis (e.g., horizontal) of FIG. 12 represents frequency (kHz) and the ordinate axis (e.g., vertical) of FIG. 12 represents duty cycle mismatch values 1212 for a high-end configuration with a capacitance of 22 microfarads (μF). As shown, the maximum duty cycle mismatch value 1214 of 0.025 corresponds to an estimated natural frequency of 20 kHz.

The absolute error between the duty cycle of the control signal and $v_{sw}$ is reported in FIG. 11 for the "low-end" configuration and the absolute error between the duty cycle of the control signal and $v_{sw}$ is reported in FIG. 12 for the "high-end" configuration. Because a linear chirp is used as stimulus, the estimate $\hat{f}_0$ is directly obtained by identifying the switching period with the highest duty cycle mismatch. As can be seen in FIG. 12, max(ΔD) is not unique for the "high-end" configuration. Therefore, the average of arg max(ΔD) is used as an estimate for $\hat{f}_0$. The corner frequency calculated from the nominal parameters listed in Table 3 as well as the estimate $\hat{f}_0$, obtained by the proposed techniques, are reported in Table 4.

TABLE 4

True corner frequency and corner frequency estimated by the proposed techniques

| Parameter | Value | Parameter | Value |
|---|---|---|---|
| $f_0$ "low-end" | 27.8 kHz | $\hat{f}_0$ "low-end" | 29 kHz |
| $f_0$ "high-end" | 18.7 kHz | $\hat{f}_0$ "high-end" | 20 kHz |
| 27.8 kHz | | | |

Figure 13:
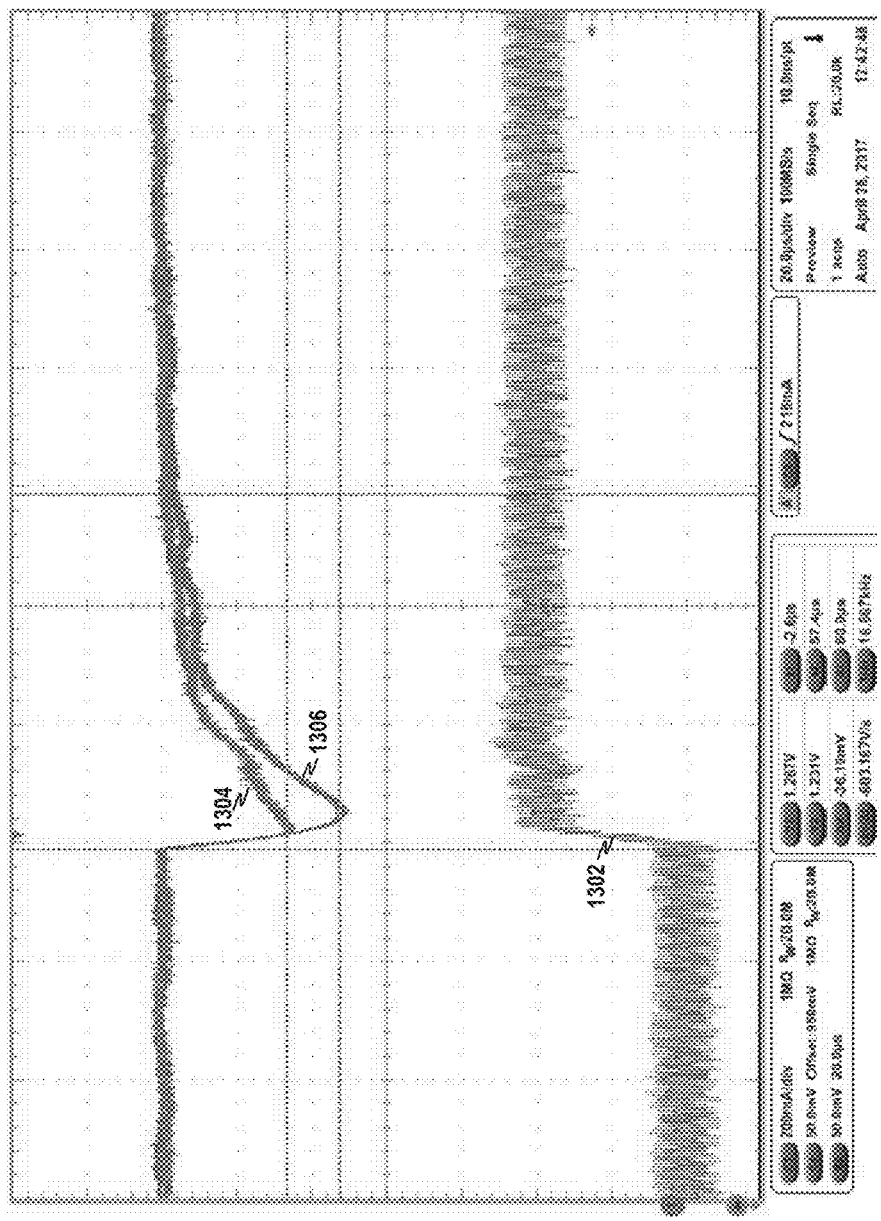
FIG. 13 is a graphical illustration of an exemplary dynamic performance of a converter using a controller with tuning and an exemplary dynamic performance of the converter using the controller without tuning, in accordance with one or more techniques of this disclosure.

FIG. 13 is a graphical illustration of an exemplary dynamic performance of a converter using a controller with tuning and an exemplary dynamic performance of the converter using the controller without tuning, in accordance with one or more techniques of this disclosure. The abscissa axis (e.g., horizontal) of FIG. 13 represents time and the ordinate axis (e.g., vertical) of FIG. 13 represents a load current 1302, tuned output voltage 1304, and untuned output voltage 1306.

In the example of FIG. 13, the estimate $\hat{f}_0$ is used to automatically tune the controller. Before tuning, the controller uses a conservative coefficient set, which ensures stability for both the "low-end" and the "high-end" configuration and over a large parameter range. In FIG. 13, the output voltage transient in response to a load jump from 0 A to 0.4 A at load current 1302 for a converter with the "low-end" configuration is shown. As can been seen, tuned output voltage 1304 has a reduced overshoot as well as a faster settling time compared to untuned output voltage 1306, while stability is still maintained.

Figure 14:
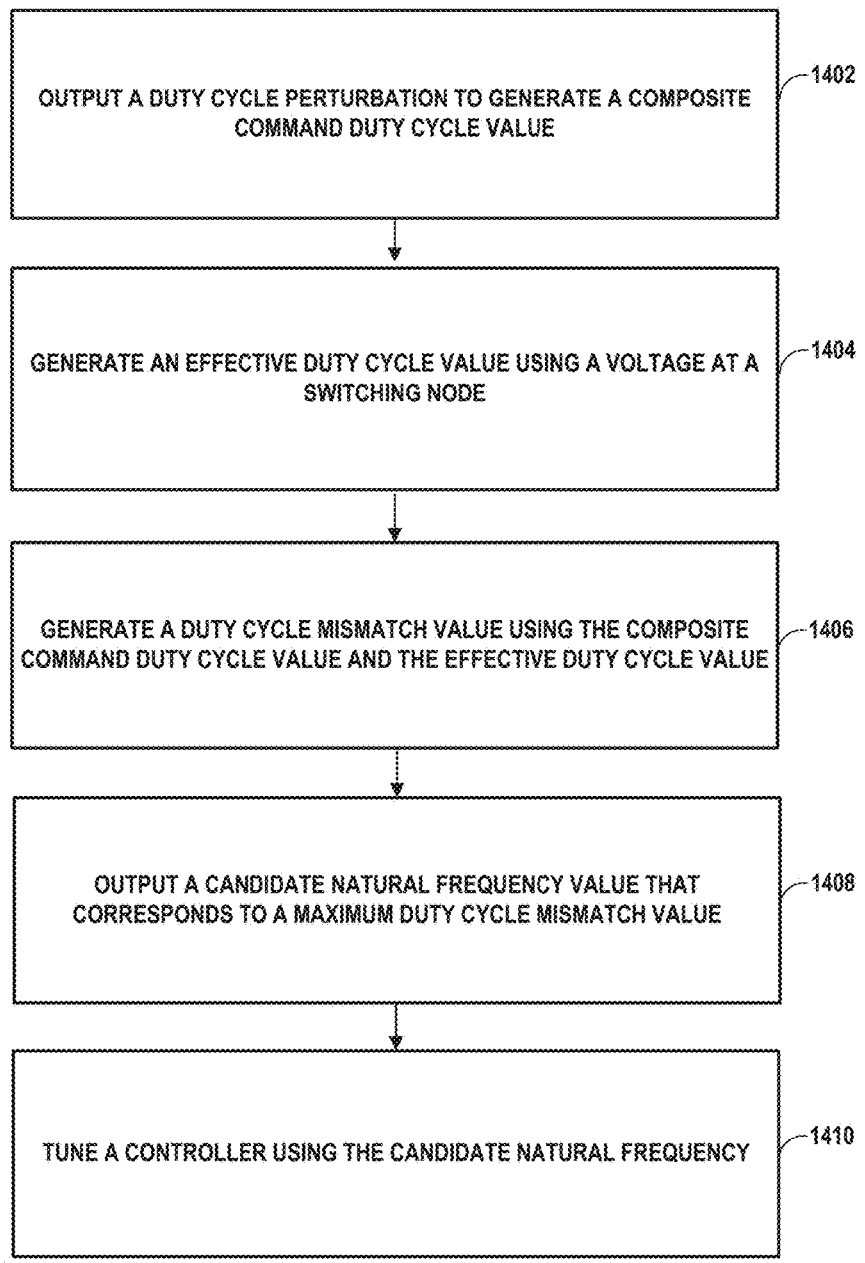
FIG. 14 is a flow diagram for controller tuning using duty cycle mismatch, in accordance with one or more techniques of this disclosure.

FIG. 14 is a flow diagram for controller tuning using duty cycle mismatch, in accordance with one or more techniques of this disclosure. FIG. 14 is discussed with reference to system 100 of FIG. 1 for exemplary purposes only.

In accordance with one or more techniques of this disclosure, perturbation module 146 outputs a duty cycle perturbation to generate a composite command duty cycle value (1402). Duty cycle estimation module 140 generates an effective duty cycle value using a voltage at a switching node (1404). Duty cycle mismatch module 142 generates a duty cycle mismatch value using the composite command duty cycle value and the effective duty cycle value (1406). Natural frequency estimation module 144 outputs a candidate natural frequency value that corresponds to a maximum duty cycle mismatch value (1408). System identification module 110 tunes a controller using the candidate natural frequency (1410).

Figure 15:
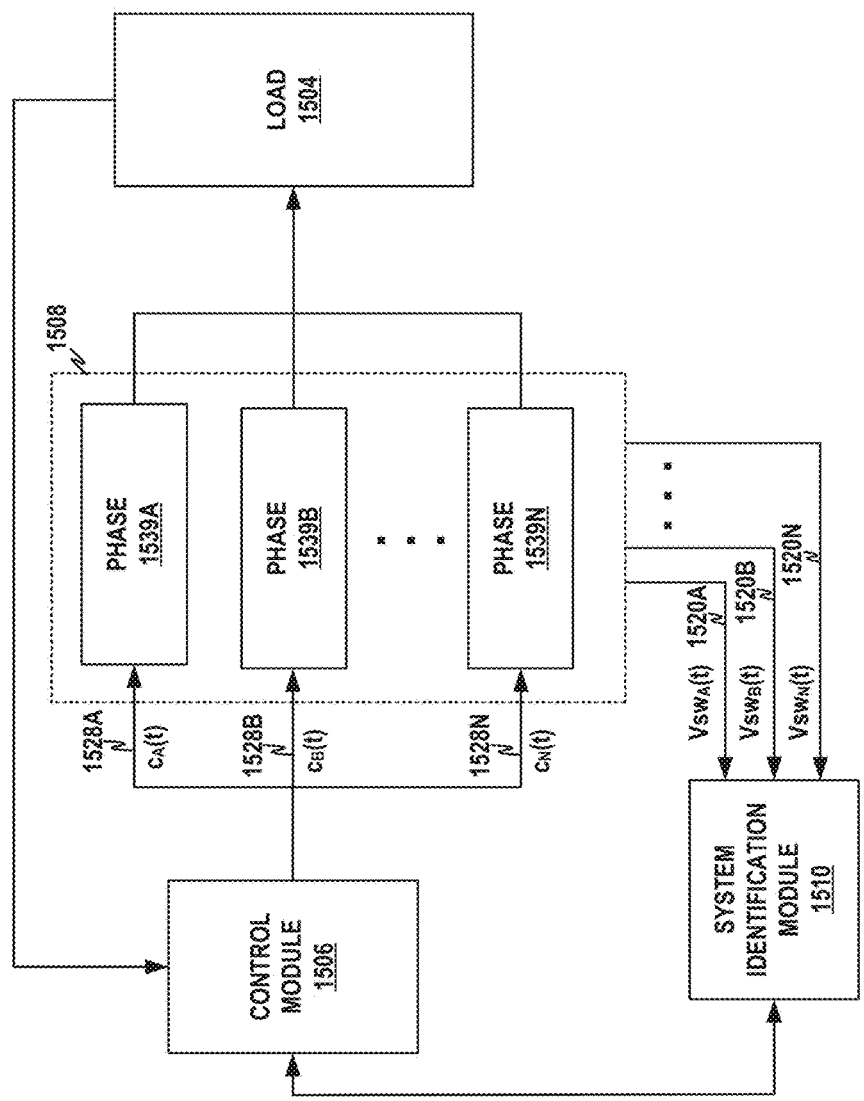
FIG. 15 is a block diagram illustrating an example multiphase system configured for controller tuning using duty cycle mismatch, in accordance with one or more techniques of this disclosure.

FIG. 15 is a block diagram illustrating an example multiphase system 1500 configured for controller tuning using duty cycle mismatch, in accordance with one or more techniques of this disclosure. As shown, system 1500 may include load 1504, control module 1506, multiphase converter 1508, and system identification module 1510. Load 1504 may be an example of load 104 of FIG. 1. Control module 1506 may be an example of control module 106 of FIG. 1. Multiphase Converter 1508 may be an example of converter 108 of FIG. 1. System identification module 1510 may be an example of system identification module 110 of FIG. 1.

In the example of FIG. 15, multiphase converter 1508 includes phases 1539A, 1539B, . . . , 1539N. In this example, control module 1506 may generate switching signals 1528A, 1528B, . . . , 1528N (hereinafter, switching signals 1528) based on respective composite command duty cycle values. That is, the perturbation is injected into each phase of multiphase converter 1508. Although, not shown, each phase in multiphase converter 1508 may include a respective high side switching unit (e.g., high side switching unit 132 of FIG. 1), a respective low side switching unit (e.g., low side switching unit 134 of FIG. 1), and respective converter components (e.g., converter components 138 of FIG. 1).

System identification module 1510 may be configured to perform, for each phase converter of multiphase converter 1508, similar techniques as described with respect to system identification module 110 of FIG. 1. For example, system identification module 1510 may be configured to receive, for each phase of multiphase converter 1508, an indication of a respective voltage ("Vsw(t)") at a respective switching node and generate, based on the voltage, an effective duty cycle value ("$D_{sw}[k]$"). For instance, system identification module 1510 may be configured to receive an indication of voltage 1520A for phase converter 1539A and generate, based on the voltage, an effective duty cycle value for phase converter 1539A. Similarly, system identification module 1510 may be configured to receive an indication of voltage 1520B for phase converter 1539B and generate, based on the voltage, an effective duty cycle value for phase converter 1539B. Further, system identification module 1510 may be configured to receive an indication of voltage 1520N for phase converter 1539N and generate, based on the voltage, an effective duty cycle value for phase converter 1539N.

System identification module 1510 may be configured to, for each phase converter of multiphase converter 1508 and for each switching period ("k"), generate, for each phase converter of multiphase converter 1508 and based on the effective duty cycle value and the composite command duty cycle value, a duty cycle mismatch value ("$\Delta D[k]$") for each phase of multiphase converter 1508.

System identification module 1510 may be configured to, for each phase converter of multiphase converter 1508, generate, based on the respective duty cycle mismatch values for different switching periods, a candidate natural frequency value ("$f_o$"). For example, system identification module 1510 may output a candidate natural frequency value of each phase of multiphase converter 1508 that corresponds to a respective maximum duty cycle mismatch.

The techniques of this disclosure may be implemented in a device or article of manufacture comprising a computer-readable storage medium. The term "processing circuitry," as used herein may refer to any of the foregoing structure or any other structure suitable for processing program code and/or data or otherwise implementing the techniques described herein. Processing circuitry of control module 106 and/or system identification module 110 may be implemented in any of a variety of types of solid state circuit elements, such as CPUs, CPU cores, GPUs, digital signal processors (DSPs), application-specific integrated circuits (ASICs), a mixed-signal integrated circuits, field programmable gate arrays (FPGAs), microcontrollers, programmable logic controllers (PLCs), programmable logic device (PLDs), complex PLDs (CPLDs), a system on a chip (SoC), any subsection of any of the above, an interconnected or distributed combination of any of the above, or any other integrated or discrete logic circuitry, or any other type of component or one or more components capable of being configured in accordance with any of the examples disclosed herein. Processing circuitry may also include analog components arranged in a mixed-signal IC.

The processing circuitry of control module 106 and/or system identification module 110 may include memory. One or more memory devices of the memory may include any volatile or non-volatile media, such as a RAM, ROM, non-volatile RAM (NVRAM), electrically erasable programmable ROM (EEPROM), flash memory, and the like. One or more memory devices of the memory may store computer readable instructions that, when executed by the processing circuitry, cause the processing circuitry to implement the techniques attributed herein to the processing circuitry.

Processing circuitry of control module 106 and/or system identification module 110 may be programmed with various forms of software. The processing circuitry may be implemented at least in part as, or include, one or more executable applications, application modules, libraries, classes, methods, objects, routines, subroutines, firmware, and/or embedded code, for example. The processing circuitry may be configured to receive voltage signals, determine switching frequencies, and deliver control signals.

The techniques of this disclosure may be implemented in a wide variety of computing devices. Any components, modules or units have been described to emphasize functional aspects and does not necessarily require realization by different hardware units. The techniques described herein may be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

The following numbered examples demonstrate one or more aspects of the disclosure.

Example 1

A device for operating a switching converter, the device being configured to: receive, for each switching period of a plurality of switching periods, a composite command duty cycle value, the composite command duty cycle value comprising a respective duty cycle perturbation of a plurality of duty cycle perturbations superimposed on a target command duty cycle value; generate, for each switching period of the plurality of switching periods, an effective duty cycle value based on a voltage at a switching node, the switching node being coupled to a high side switching element of a converter and coupled to a low side switching element of the converter, wherein the high side switching element and the low side switching element are activated based on the composite command duty cycle value; generate, for each switching period of the plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the converter; and output a candidate natural frequency value of the converter that corresponds to a maximum duty cycle mismatch of the plurality of duty cycle mismatch values.

Example 2

The device of example 1, wherein a duty cycle perturbation of the plurality of duty cycle perturbations comprises a frequency different from another duty cycle perturbation of the plurality of duty cycle perturbations.

Example 3

The device of any combination of examples 1-2, wherein the device is configured to: output the plurality of duty cycle perturbations, wherein to output the plurality of duty cycle perturbations the device is configured to generate a linear chirp signal, a non-linear chirp signal, or a rectangular chirp signal.

Example 4

The device of any combination of examples 1-3, wherein the target command duty cycle value operates the converter in a region where inductor current of the converter is partially negative during a switching period of the plurality of switching periods.

Example 5

The device of any combination of examples 1-4, wherein the device comprises a pulse-width modulator configured to generate a switching signal to activate the high side switching element and the low side switching element based on the composite command duty cycle value.

Example 6

The device of any combination of examples 1-5, wherein the device comprises a dead time module configured to generate a modified switching signal based on the switching signal that deactivates the high side switching element and the low side switching element before activating the low side switching element and that deactivates the high side switching element and the low side switching element before activating the high side switching element.

Example 7

The device of any combination of examples 1-6, wherein, to generate the effective duty cycle value, the device is configured to: determine a rising edge of the voltage at the switching node; determine a falling edge of the voltage at the switching node; and generate the effective duty cycle value based on the falling edge and the rising edge.

Example 8

The device of any combination of examples 1-7, wherein, to generate the effective duty cycle value based on the falling edge and the rising edge, the device is configured to: reset a count value in response to the rising edge; and increment the count value until the falling edge.

Example 9

The device of any combination of examples 1-8, wherein, to generate the duty cycle mismatch value, the device is configured to: subtract the effective duty cycle value from the composite command duty cycle value.

Example 10

The device of any combination of examples 1-9, wherein, to output the candidate natural frequency value, the device is configured to: output the candidate natural frequency value to a controller, wherein the controller is tuned using the candidate natural frequency value.

Example 11

The device of any combination of examples 1-10, further comprising: the low side switching element, wherein the low side switching element has a first node coupled to the switching node, a second node coupled to a reference node, and a gate node, the gate node of the low side switching element receiving a low side driving signal that is generated using the composite command duty cycle value; the high side switching element, wherein the high side switching element has a first node coupled to the switching node, a second node coupled to a voltage source, and a gate node, the gate node of the high side switching element receiving a high side driving signal that is generated using the composite command duty cycle value, wherein the high side switching element includes a body diode having an anode coupled to the switching node and a cathode coupled to the voltage source; and the converter comprises: an inductor having a first node coupled to the switching node and a second node; and a capacitor having a first node coupled to the second node of the inductor and a second node coupled to the reference node.

Example 12

The device of any combination of examples 1-11, wherein the converter is a multiphase converter, wherein the switching node, the composite command duty cycle value, the effective duty cycle value, and the candidate natural frequency value are for a first phase of the multiphase converter, wherein the device is further configured to: generate an effective duty cycle for a second phase based on a voltage at a switching node for the second phase; generate a duty cycle mismatch value for the second phase based on a composite command duty cycle value for the second phase and the effective duty cycle value for the second phase; and output a candidate natural frequency value for the second phase based on the duty cycle mismatch value for the second phase.

Example 13

A method for operating a switching converter, the method comprising: receiving, for each switching period of a plurality of switching periods, a composite command duty cycle value, the composite command duty cycle value comprising a respective duty cycle perturbation of a plurality of duty cycle perturbations superimposed on a target command duty cycle value; generating, for each switching period of the plurality of switching periods, an effective duty cycle value based on a voltage at a switching node, the switching node being coupled to a high side switching element of a converter and coupled to a low side switching element of the converter, wherein the high side switching element and the low side switching element are activated based on the composite command duty cycle value; generating, for each switching period of the plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the converter; and outputting a candidate natural frequency value of the converter that corresponds to a maximum duty cycle mismatch of the plurality of duty cycle mismatch values.

Example 14

The method of example 13, wherein a duty cycle perturbation of the plurality of duty cycle perturbations comprises a frequency different from another duty cycle perturbation of the plurality of duty cycle perturbations.

Example 15

The method of any combination of examples 13-14, further comprising: outputting the plurality of duty cycle perturbations, wherein outputting the plurality of duty cycle perturbations comprises generating a linear chirp signal, a non-linear chirp signal, or a rectangular chirp signal.

Example 16

The method of any combination of examples 13-15, wherein the target command duty cycle value operates the converter in a region where inductor current of the converter is partially negative during a switching period of the plurality of switching periods.

Example 17

The method of any combination of examples 13-16, wherein generating the effective duty cycle value comprises: determining a rising edge of the voltage at the switching node; determining a falling edge of the voltage at the switching node; and generating the effective duty cycle value based on the falling edge and the rising edge.

Example 18

The method of any combination of examples 13-17, wherein generating the effective duty cycle value based on the falling edge and the rising edge comprises: resetting a count value in response to the rising edge; and incrementing the count value until the falling edge.

Example 19

A system comprising: a voltage source; a load; a switching converter configured to receive power from the voltage source and to output power to the load, the switching converter comprising: a low side switching element has a first node coupled to a switching node, a second node coupled to a reference node, and a gate node; and a high side switching element has a first node coupled to the switching node, a second node coupled to the voltage source, and a gate node, the high side switching element including a diode having an anode coupled to the switching node and a cathode coupled to the voltage source; a control module configured to generate a switching signal to activate the high side switching element and the low side switching element based on the composite command duty cycle value; and a system identification module configured to: output, to the control module, for each switching period of a plurality of switching periods for the switching converter, a duty cycle perturbation of a plurality of duty cycle perturbations; receive, from the control module, a composite command duty cycle value, the composite command duty cycle value comprising a respective duty cycle perturbation of the plurality of duty cycle perturbations superimposed on a target command duty cycle value; generate, for each switching period of the plurality of switching periods, an effective duty cycle value based on a voltage at the switching node; generate, for each switching period of a plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the switching converter; and output, to the control module, a candidate natural frequency value of the switching converter that corresponds to a maximum duty cycle mismatch of the plurality of duty cycle mismatch values.

Example 20

The system of example 19, wherein the control module is configured to: determine a correction factor for a controller using the candidate natural frequency value; determine a tuned coefficient gain using the correction factor; and output, to the controller, an indication of the tuned coefficient gain.

Various examples of the disclosure have been described. Any combination of the described systems, operations, or functions is contemplated. These and other examples are within the scope of the following claims.

What is claimed is:

1. A device for operating a switching converter, the device being configured to:
receive, for each switching period of a plurality of switching periods, a composite command duty cycle value, the composite command duty cycle value comprising a respective duty cycle perturbation of a plurality of duty cycle perturbations superimposed on a target command duty cycle value;
generate, for each switching period of the plurality of switching periods, an effective duty cycle value based on a voltage at a switching node, the switching node being coupled to a high side switching element of a converter and coupled to a low side switching element of the converter, wherein the high side switching element and the low side switching element are activated based on the composite command duty cycle value;
generate, for each switching period of the plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the converter; and
output a candidate natural frequency value of the converter that corresponds to a maximum duty cycle mismatch of the plurality of duty cycle mismatch values.

2. The device of claim 1, wherein a duty cycle perturbation of the plurality of duty cycle perturbations comprises a frequency different from another duty cycle perturbation of the plurality of duty cycle perturbations.

3. The device of claim 1, wherein the device is configured to:
output the plurality of duty cycle perturbations, wherein to output the plurality of duty cycle perturbations the device is configured to generate a linear chirp signal, a non-linear chirp signal, or a rectangular chirp signal.

4. The device of claim 1, wherein the target command duty cycle value operates the converter in a region where inductor current of the converter is partially negative during a switching period of the plurality of switching periods.

5. The device of claim 1, wherein the device comprises a pulse-width modulator configured to generate a switching signal to activate the high side switching element and the low side switching element based on the composite command duty cycle value.

6. The device of claim 5, wherein the device comprises a dead time module configured to generate a modified switching signal based on the switching signal that deactivates the high side switching element and the low side switching element before activating the low side switching element and that deactivates the high side switching element and the low side switching element before activating the high side switching element.

7. The device of claim 1, wherein, to generate the effective duty cycle value, the device is configured to:
determine a rising edge of the voltage at the switching node;
determine a falling edge of the voltage at the switching node; and
generate the effective duty cycle value based on the falling edge and the rising edge.

8. The device of claim 7, wherein, to generate the effective duty cycle value based on the falling edge and the rising edge, the device is configured to:
reset a count value in response to the rising edge; and
increment the count value until the falling edge.

9. The device of claim 1, wherein, to generate the duty cycle mismatch value, the device is configured to:
subtract the effective duty cycle value from the composite command duty cycle value.

10. The device of claim 1, wherein, to output the candidate natural frequency value, the device is configured to:
output the candidate natural frequency value to a controller, wherein the controller is tuned using the candidate natural frequency value.

11. The device of claim 1, further comprising:
the low side switching element, wherein the low side switching element has a first node coupled to the switching node, a second node coupled to a reference node, and a gate node, the gate node of the low side switching element receiving a low side driving signal that is generated using the composite command duty cycle value;
the high side switching element, wherein the high side switching element has a first node coupled to the switching node, a second node coupled to a voltage source, and a gate node, the gate node of the high side switching element receiving a high side driving signal that is generated using the composite command duty cycle value, wherein the high side switching element includes a body diode having an anode coupled to the switching node and a cathode coupled to the voltage source; and
the converter comprises:
an inductor having a first node coupled to the switching node and a second node; and
a capacitor having a first node coupled to the second node of the inductor and a second node coupled to the reference node.

12. The device of claim 1, wherein the converter is a multiphase converter, wherein the switching node, the composite command duty cycle value, the effective duty cycle value, and the candidate natural frequency value are for a first phase of the multiphase converter, wherein the device is further configured to:
generate an effective duty cycle for a second phase based on a voltage at a switching node for the second phase;
generate a duty cycle mismatch value for the second phase based on a composite command duty cycle value for the second phase and the effective duty cycle value for the second phase; and
output a candidate natural frequency value for the second phase based on the duty cycle mismatch value for the second phase.

13. A method for operating a switching converter, the method comprising:
receiving, for each switching period of a plurality of switching periods, a composite command duty cycle value, the composite command duty cycle value comprising a respective duty cycle perturbation of a plurality of duty cycle perturbations superimposed on a target command duty cycle value;
generating, for each switching period of the plurality of switching periods, an effective duty cycle value based on a voltage at a switching node, the switching node being coupled to a high side switching element of a converter and coupled to a low side switching element of the converter, wherein the high side switching element and the low side switching element are activated based on the composite command duty cycle value;
generating, for each switching period of the plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the converter; and
outputting a candidate natural frequency value of the converter that corresponds to a maximum duty cycle mismatch of the plurality of duty cycle mismatch values.

14. The method of claim 13, wherein a duty cycle perturbation of the plurality of duty cycle perturbations comprises a frequency different from another duty cycle perturbation of the plurality of duty cycle perturbations.

15. The method of claim 13, further comprising:
outputting the plurality of duty cycle perturbations, wherein outputting the plurality of duty cycle perturbations comprises generating a linear chirp signal, a non-linear chirp signal, or a rectangular chirp signal.

16. The method of claim 13, wherein the target command duty cycle value operates the converter in a region where inductor current of the converter is partially negative during a switching period of the plurality of switching periods.

17. The method of claim 13, wherein generating the effective duty cycle value comprises:
determining a rising edge of the voltage at the switching node;
determining a falling edge of the voltage at the switching node; and
generating the effective duty cycle value based on the falling edge and the rising edge.

18. The method of claim 17, wherein generating the effective duty cycle value based on the falling edge and the rising edge comprises:
resetting a count value in response to the rising edge; and
incrementing the count value until the falling edge.

19. A system comprising:
a voltage source;
a load;
a switching converter configured to receive power from the voltage source and to output power to the load, the switching converter comprising:
a low side switching element has a first node coupled to a switching node, a second node coupled to a reference node, and a gate node; and
a high side switching element has a first node coupled to the switching node, a second node coupled to the voltage source, and a gate node, the high side switching element including a diode having an anode coupled to the switching node and a cathode coupled to the voltage source;
a control module configured to generate a switching signal to activate the high side switching element and the low side switching element based on the composite command duty cycle value; and
a system identification module configured to:
output, to the control module, for each switching period of a plurality of switching periods for the switching converter, a duty cycle perturbation of a plurality of duty cycle perturbations;
receive, from the control module, a composite command duty cycle value, the composite command duty cycle value comprising a respective duty cycle perturbation of the plurality of duty cycle perturbations superimposed on a target command duty cycle value;
generate, for each switching period of the plurality of switching periods, an effective duty cycle value based on a voltage at the switching node;
generate, for each switching period of a plurality of switching periods, a duty cycle mismatch value using the composite command duty cycle value and the effective duty cycle value so as to generate a plurality of duty cycle mismatch values, each duty cycle mismatch value of the plurality of duty cycle mismatch values corresponding to a candidate natural frequency value of the switching converter; and
output, to the control module, a candidate natural frequency value of the switching converter that corresponds to a maximum duty cycle mismatch of the plurality of duty cycle mismatch values.

20. The system of claim 19, wherein the control module is configured to:
determine a correction factor for a controller using the candidate natural frequency value;
determine a tuned coefficient gain using the correction factor; and
output, to the controller, an indication of the tuned coefficient gain.

* * * * *